US010640631B2

(12) United States Patent
Onishi et al.

(10) Patent No.: US 10,640,631 B2
(45) Date of Patent: May 5, 2020

(54) THERMALLY CONDUCTIVE RESIN COMPOSITION

(71) Applicant: KANEKA CORPORATION, Osaka-shi (JP)

(72) Inventors: Yoshifumi Onishi, Settsu (JP); Koichi Nishiura, Settsu (JP); Shinpei Miyamoto, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 336 days.

(21) Appl. No.: 15/739,175

(22) PCT Filed: Jun. 30, 2016

(86) PCT No.: PCT/JP2016/069368
§ 371 (c)(1),
(2) Date: Dec. 22, 2017

(87) PCT Pub. No.: WO2017/002890
PCT Pub. Date: Jan. 5, 2017

(65) Prior Publication Data
US 2018/0171113 A1 Jun. 21, 2018

(30) Foreign Application Priority Data
Jul. 2, 2015 (JP) .................. 2015-133943

(51) Int. Cl.
| | | |
|---|---|---|
| C08K 13/02 | (2006.01) |
| C08K 3/22 | (2006.01) |
| H01L 23/373 | (2006.01) |
| C09K 5/06 | (2006.01) |
| C08K 5/20 | (2006.01) |
| H01L 23/36 | (2006.01) |
| C08K 5/10 | (2006.01) |
| C08K 3/34 | (2006.01) |
| C08K 3/08 | (2006.01) |
| C08K 7/18 | (2006.01) |
| C08K 5/103 | (2006.01) |
| C08K 3/38 | (2006.01) |
| C08K 3/14 | (2006.01) |
| C08K 3/28 | (2006.01) |
| C08L 33/08 | (2006.01) |
| C08L 101/08 | (2006.01) |

(52) U.S. Cl.
CPC ............ *C08K 13/02* (2013.01); *C08K 3/08* (2013.01); *C08K 3/14* (2013.01); *C08K 3/22* (2013.01); *C08K 3/28* (2013.01); *C08K 3/34* (2013.01); *C08K 3/38* (2013.01); *C08K 5/10* (2013.01); *C08K 5/103* (2013.01); *C08K 5/20* (2013.01); *C08K 7/18* (2013.01); *C08L 33/08* (2013.01); *C08L 101/08* (2013.01); *C09K 5/06* (2013.01); *H01L 23/36* (2013.01); *H01L 23/373* (2013.01); *C08K 2201/003* (2013.01); *C08K 2201/005* (2013.01)

(58) Field of Classification Search
CPC ...................................................... C08K 3/38
See application file for complete search history.

(56) References Cited

U.S. PATENT DOCUMENTS

| | | | |
|---|---|---|---|
| 5,057,457 | A | 10/1991 | Miyahara et al. |
| 2007/0142528 | A1 | 6/2007 | Oshima et al. |
| 2008/0295959 | A1 | 12/2008 | Ishigaki et al. |

FOREIGN PATENT DOCUMENTS

| | | |
|---|---|---|
| CN | 103952077 A | 7/2014 |
| EP | 1 698 664 A1 | 9/2006 |
| EP | 1 997 862 A1 | 12/2008 |
| JP | 3-101154 A | 4/1991 |
| JP | 5-59352 A | 3/1993 |
| JP | 7-157750 A | 6/1995 |
| JP | 2002-234952 A | 8/2002 |
| JP | 2004-161885 A | 6/2004 |
| JP | 3794996 B2 | 7/2006 |
| JP | 2006-312708 A | 11/2006 |
| JP | 2008-214535 A | 9/2008 |
| JP | 2010-195960 A | 9/2010 |
| JP | 2013-189625 A | 9/2013 |

OTHER PUBLICATIONS

International Search Report dated Sep. 13, 2016 in PCT/JP2016/069368 filed Jun. 30, 2016.
Extended European Search Report dated Feb. 5, 2019 in European Patent Application No. 16817998.4, 7 pages.

*Primary Examiner* — Wenwen Cai
(74) *Attorney, Agent, or Firm* — Oblon, McClelland, Maier & Neustadt, L.L.P.

(57) ABSTRACT

The present invention relates to a thermally conductive resin composition containing a resin (A) having a melting point of 40 to 100° C. and an inorganic filler (B), wherein the resin (A) has a weight loss of less than 10% when the resin (A) is stored at 150° C. for 100 hours under an atmosphere. The thermally conductive resin composition of the present invention is suitably used for a thermal interface material (TIM), particularly TIM for a semiconductor module.

9 Claims, No Drawings

THERMALLY CONDUCTIVE RESIN COMPOSITION

TECHNICAL FIELD

The present invention relates to a thermally conductive resin composition and a thermal interface material (TIM) using the same.

BACKGROUND ART

A heat dissipating material has been widely used because a semiconductor module generates a lot of heat. On the other hand, the further development has been expected in a power semiconductor used in an electric car, an inverter and a converter of power transmission system, and silicon has been used in a semiconductor element of the power semiconductor. In addition, SiC (silicon carbide) and GaN (gallium nitride) also have been gradually used in the viewpoint of the possibility of greatly decreased power loss, high voltage endurance, and operable property at high temperature, and a heat dissipating material corresponding to these has been required.

Particularly, a thermal interface material (TIM) has been important element in thermal management of the whole semiconductor module. In grease such as silicon which often have been used as this TIM, it is known that a low molecular weight component contained in TIM is separated by use for long time, and the separation of the low molecular weight components has no effect on thermal conductivity. Therefore, a material which is softened at the high temperature without containing a low molecular weight component and serves as TIM is desirable. However, there is a problem that paraffin often has been used as a main raw material, so that it is difficult to exhibit sufficient heat resistance (Patent Document 1).

PRIOR ART DOCUMENTS

Patent Document

Patent Document 1: Japanese Patent No. 3794996

SUMMARY OF THE INVENTION

Problems to be Solved by the Invention

Concretely, paraffin used in Patent Document 1 has a melting point of 30 to 120° C. and is solid at an ambient temperature. However, the present inventors have found that paraffin has a weight loss of 10% or more when stored at 150° C. for 100 hours under an atmosphere, and the heat resistance at high temperature needed in TIM is insufficient.

The object of the present invention is to provide a thermally conductive resin composition in which the resin is hardly deteriorated under an atmosphere at 150° C. and a thermal interface material containing the thermally conductive resin composition.

Solutions to the Problems

The present inventors have found that the thermally conductive resin composition in which the resin is hardly deteriorated under an atmosphere at 150° C. and the thermal interface material containing the thermally conductive resin composition can be provided, to complete the present invention.

That is, the gist of the present invention is as follows:
1) A thermally conductive resin composition comprising a resin (A) having a melting point of 40 to 100° C. and an inorganic filler (B), wherein the resin (A) has a weight loss of less than 10% when the resin (A) is stored at 150° C. for 100 hours under an atmosphere.
2) The thermally conductive resin composition according to 1), wherein the resin (A) comprises an aliphatic hydrocarbon compound having 1 to 100 carbon atoms and a functional group.
3) The thermally conductive resin composition according to 1) or 2), wherein the resin (A) comprises a fatty acid ester or a fatty acid amide having 1 to 100 carbon atoms.
4) The thermally conductive resin composition according to any one of 1) to 3), wherein the inorganic filler (B) is at least one inorganic filler selected from the group consisting of a metal, a metal oxide, a metal nitride, and a metal carbide.
5) The thermally conductive resin composition according to any one of 1) to 4), wherein the inorganic filler (B) has a spherical shape, a scaly shape or a shatter shape.
6) The thermally conductive resin composition according to any one of 1) to 5), further comprising a liquid resin (C) having a viscosity of 100 Pa·s or less at 25° C., wherein the liquid resin (C) has a weight loss of less than 10% when the liquid resin (C) is stored at 150° C. for 100 hours under an atmosphere.
7) The thermally conductive resin composition according to any one of 1) to 6), wherein the liquid resin (C) comprises an acrylate resin or a polybasic acid ester resin.
8) The thermally conductive resin composition according to any one of 1) to 7), wherein the inorganic filler (B) is contained in an amount of 50 to 90% by weight per 100% by weight of the thermally conductive resin composition.
9) The thermally conductive resin composition according to any one of 1) to 8), wherein a spherical powder is contained in the inorganic filler (B), and an amount of the spherical powder is 50% by weight or more per 100% by weight of a total amount of the inorganic filler (B).
10) The thermally conductive resin composition according to any one of 1) to 9), wherein the spherical powder is contained in the inorganic filler (B), and an amount of the spherical powder is 90% by weight or more per 100% by weight of a total amount of the inorganic filler (B).
11) The thermally conductive resin composition according to any one of 1) to 10), wherein the inorganic filler (B) is a powder having an average particle diameter of 50 μm or less.
12) The thermally conductive resin composition according to 11), wherein an average particle diameter of the powder is 20 μm or less.
13) The thermally conductive resin composition according to any one of 1) to 12), wherein a powder having an average particle diameter of 1 to 3 μm is contained in the inorganic filler (B), and an amount of the powder is 40% by weight or more per 100% by weight of a total amount of the inorganic filler (B).
14) The thermally conductive resin composition according to any one of 1) to 13), wherein the powder having an average particle diameter of 1 to 3 μm is contained in the inorganic filler (B), an amount of the powder is 40% by weight or more per 100% by weight of a total amount of the inorganic filler (B), the spherical powder is contained in the inorganic filler (B), and an amount of the spherical powder is 90% by weight or more per 100% by weight of a total amount of the inorganic filler (B).
15) The thermally conductive resin composition according to any one of 1) to 14), wherein the powder having an average particle diameter of 4 to 20 μm is contained in the inorganic filler (B), and an amount of the powder is 40% by weight or more per 100% by weight of a total amount of the inorganic filler (B).

16) The thermally conductive resin composition according to any one of 1) to 15), wherein the powder having an average particle diameter of 4 to 20 μm is contained in the inorganic filler (B), an amount of the powder is 40% by weight or more per 100% by weight of a total amount of the inorganic filler (B), the spherical powder is contained in the inorganic filler (B), and an amount of the spherical powder is more than 80% by weight per 100% by weight of a total amount of the inorganic filler (B).

17) A thermal interface material comprising the thermally conductive resin composition as defined in any one of 1) to 16).

18) A thermal interface material for a semiconductor module comprising the thermally conductive resin composition as defined in any one of 1) to 16).

Effects of the Invention

The thermally conductive resin composition of the present invention is used for a heat dissipating resin composition of a semiconductor package suitable for TIM due to high heat resistance for a long period. Particularly, effects of effectively realizing thermal management of future generation semiconductor module containing SiC and the like are exhibited.

MODES FOR CARRYING OUT THE INVENTION

Hereinafter, one embodiment of the present invention is explained, and the present invention is not limited to the one embodiment.

The thermally conductive resin composition of the present invention contains a resin (A) having a melting point of 40 to 100° C. and an inorganic filler (B), and the resin (A) has a weight loss of less than 10% when stored at 150° C. for 100 hours under an atmosphere.

Each of components is explained hereinafter.
Resin (Compound) (A) having a melting point of 40 to 100° C.:

In the present invention, the resin (A) is not exactly a polymer material obtained by a polymerization, a polycondesation, a polyaddition, and the like, and the resin (A) is a compound capable of reversibly changing from a state that the compound is softened at heating and is plastically changed to mold any shape to a state that the compound is solidified at cooling. In addition, the thermally conductive resin composition of the present invention may be referred to as a thermally conductive composition. By selecting the resin (A) satisfying the above conditions, the resin (A) can be softened at high temperature to serve as TIM. The melting point of the resin (A) is not limited particularly, and is 40 to 100° C., preferably 40 to 80° C., and more preferably 45 to 65° C. In the case where the melting point of the resin (A) is less than 40° C., the handling of the composition becomes difficult, while in the case where the melting point of the resin (A) is more than 100° C., use of the composition as TIM becomes difficult in some cases. The melting point of the resin (A) may be determined by observing a state change of the resin (A) during the increase of the temperature, and measuring a temperature at the time when the resin (A) is completely melted.

The resin (A) is preferably an aliphatic hydrocarbon compound having 1 to 100 carbon atoms and a functional group.

The aliphatic hydrocarbon compound may be saturated or unsaturated. In the case where the resin (A) is unsaturated, an unsaturated bond such as a carbon-carbon double bond, and a carbon-carbon triple bond may be bonded or substituted at any site of the aliphatic hydrocarbon compound as long as the unsaturated bond is not directly bonded with the functional group.

In addition, the aliphatic hydrocarbon compound may be linear, branched, or cyclic.

The linear aliphatic hydrocarbon compound includes a linear alkane such as methane, ethane, propane, butane, pentane, hexane, heptane, octane, nonane, decane, undecane, dodecane, tetradecane, hexadecane, heptadecane, and icosane.

The branched aliphatic hydrocarbon compound includes a branched alkane such as 2,2-dimethyl-1,3-propane, 2-methylpentane, 2,2-dimethylbutane, 2,3-dimethylbutane, 2-methylhaxane, 3-methylhaxane, 2,3-dimethylpentane, 2,4-dimethylpentane, 2-methylheptane, 3-methylheptane, 4-methylheptane, 3-methylhaxane, 2,2-dimethylhaxane, 2,3-dimethylhaxane, 2,4-dimethylhaxane, 2,5-dimethylhaxane, 3,3-dimethylhaxane, 3,4-dimethylhaxane, 2-methyl-3-ethylpentane, 3-methyl-3-ethylpentane, 2,3,3-trimethylpantane, 2,3,4-trimethylpentane, 2,3,3,3-tetramethylbutane, and 2,2,5-trimethylhaxane.

The cyclic aliphatic hydrocarbon compound includes a cycloalkane such as cyclopropane, cyclobutane, cyclopentane, cyclohaxane, cycloheptane, cyclooctane, cyclononane, cyclodecane, cycloundecane, cyclododecane, cyclotetradecane, cyclohexadecane, cycloheptadecane and the like; norboLnane, adamantane, and the like.

The aliphatic hydrocarbon compound has preferably 5 to 99 carbon atoms, more preferably 10 to 98 carbon atoms, even preferably 12 to 97 carbon atoms, even more preferably 22 to 96 carbon atoms, and particularly preferably 30 to 95 carbon atoms.

The functional group may be bonded to the aliphatic hydrocarbon compound, and may be substituted with a part of the aliphatic hydrocarbon compound. The functional group may be hydroxyl group, ester group, amino group, carboxyl group, epoxy group, thiol group, amide group, sulfonyl group, imino group, ether group, carbamoyl group, cyano group and the like. Among these, the functional group is particularly preferably ester group, amino group, carboxyl group, amide group, and most preferably ester group, amide group.

The resin (A) particularly preferably contains a fatty acid ester or a fatty acid amide having 1 to 100 carbon atoms.

The fatty acid ester may be dehydrated condensate of a hydric or polyhydric alcohol with the fatty acid, and may be dehydrated condensate of the fatty acid with a compound in which one or more hydroxyl groups are bonded with the aliphatic hydrocarbon compound.

A fatty acid of the fatty acid ester may be saturated or unsaturated.

The saturated fatty acid includes a saturated fatty acid having 4 to 30 carbon atoms such as butanoic acid (butyric acid), pentanoic acid (valeric acid), hexanoic acid (caproic acid), heptanoic acid (enanthic acid), octanoic acid (caprylic acid), nonanoic acid (pelargonic acid), decanoic acid (capric acid), dedocanoic acid (lauric acid), tetradecanoic acid (myristic acid), pentadecanoic acid, hexadecanoic acid (palmitic acid), heptadecanoic acid (margaric acid), octadecanoic acid (stearic acid), icosanoic acid (arachidic acid), heneicosylic acid, docosanoic acid (behenic acid), tetradocosanoic acid (lignoceric acid), hexadocosanoic acid (cerotic acid), octadocosanoic acid (montanic acid), melissic acid and the like.

The unsaturated fatty acid includes 9-hexadecenoic acid (palmitoleic acid), cis-9-octadecenoic acid (oleic acid), 11-octadecenoic acid (vaccenic acid), cis-cis-9,12-octadecadienoic acid (linoleic acid), 9,12,15-octadecatrienoic acid ((9,12,15)-linoleic acid), 6,9,12-octadecatrienoic acid ((6,9,12)-linoleic acid), 9,11,13-octadecatrienoic acid (eleostearic acid), 8,11-eicosadienoic acid, 5,8,11-eicosatrienoic acid, 5,8,11,14-eicosatetraenoic acid (arachidonic acid), and cis-15-tetracosenoic acid (nervonic acid). The unsaturated fatty acid may be used individually or in the combination of two or more unsaturated fatty acids.

The fatty acid has preferably 6 to 28 carbon atoms, more preferably 8 to 26 carbon atoms, even preferably 10 to 24 carbon atoms, and even more preferably 12 to 22 carbon atoms.

The fatty acid ester may be monoester or polyester. The fatty acid ester of the monoester includes lauric acid methyl ester, myristic acid methyl ester, palmitic acid methyl ester, stearic acid methyl ester, oleic acid methyl ester, erucic acid methyl ester, behenic acid methyl ester, lauric acid butyl ester, stearic acid butyl ester, myristic acid isopropyl ester, palmitoic acid isopropyl ester, palitoic acid octyl ester, stearic acid octyl ester, lauric acid lauryl ester, behenic acid behenyl ester, myristic acid cetyl ester and the like.

The fatty acid ester of the polyester includes glycerine fatty acid ester, propylene glycol fatty acid ester, pentaerythritol fatty acid ester, polyoxyethylene sorbitan fatty acid ester, polyoxyethylene glycerine fatty acid ester, polyethylene glycol fatty acid ester and the like.

Among these, the fatty acid ester is preferably the fatty acid ester of the polyester, more preferably pentaerythritol fatty acid ester, and even preferably an esterified compound obtained by dehydrating condensation of pentaerythritol with fatty acid having 12 to 22 carbon atoms.

The fatty acid amide may be dehydrated condensate of amine such as ammnonia, and ethylenediamine with fatty acid.

The fatty acid amide may be monoamide having an amide at terminal of molecule, monoamide or diamide having a substituted amide at a portion other than terminal of molecule, monoamide having a methylol amide bonded at terminal of molecule, and the like. The fatty acid of the fatty acid amide may be saturated or unsaturated, and includes fatty acid explained in the above fatty acid ester.

The monoamide includes a saturated fatty acid amide such as lauric acid amide, palmitic acid amide, stearic acid amide, behenic acid amide, hydroxystearic acid amide; unsaturated fatty acid amide such as oleic acid amide, erucic acid amide; substituted unsaturated fatty acid amide such as N-oleyl palmitic acid amide, N-stearyl stearic acid amide, N-stearyl oleic acid amide, N-oleyl stearic acid amide, N-stearyl erucic acid amide; methylol amide such as methylol stearic acid amide; and the like.

The diamide includes a saturated fatty acid bisamide such as methylenebisstearic acid amide, ethylenebiscapric acid amide, ethylenebislauric acid amide, ethylenebisstearic acid amide, ethylenebishydroxystearic acid amide, ethylenebisbehenic acid amide, hexamethylenebisstearic acid amide, hexamethylenebisbehenic acid amide, hexamethylenehydroxystearic acid amide, N,N'-distearyladipic acid amide, N,N'-distearylsebacic acid amide; unsaturated fatty acid bisamide such as ethylenebisoleic acid amide, ethylenebiserucic acid amide, hexamethylenebisoleic acid amide, N,N'-dioleyladipic acid amide, N,N'-dioleylsebacic acid amide; and the like.

Among these, the diamide is preferably unsaturated fatty acid amide, more preferably unsaturated fatty acid monoamide, and even preferably oleic acid amide.

A kind of the resin (A) includes parrafin wax and the like other than the fatty acid ester and the fatty acid amide.

Particularly, at least one of the fatty acid ester and the fatty acid amide is preferably contained in the viewpoint of giving sufficient heat resistance to the composition.

In addition, the resin (A) has a weight loss of less than 10%, preferably 9.9% or less, more preferably 9.8% or less, and even preferably 9.7% or less, when the resin (A) is stored at 150° C. for 100 hours under an atmosphere. The lower limit of the weight loss is, for example, 0%, or 2%. When the weight loss is more than 10%, it is difficult to exhibit sufficient heat resistance of the composition in some cases. The weight loss may be obtained by setting 2 g of a resin on a petri dish having a diameter of 45 mm, and measuring a weight loss of the resin when stored at 150° C. for 100 hours under an atmosphere, as set forth below.

The resin (A) is contained in an amount of preferably 0.1 to 60% by weight, more preferably 0.2 to 55% by weight, even preferably 0.5 to 50% by weight, and even more preferably 1.0 to 10% by weight per 100% by weight of the thermally conductive resin composition. When the amount of the resin (A) is small, it is difficult to use the composition as TIM in some cases. On the other hand, when the amount of the resin (A) is large, the thermal conductivity is decreased in some cases.

Inorganic Filler (B):

The inorganic filler (B) is preferably at least one inorganic filler selected from the group consisting of a metal, a metal oxide, a metal nitride, and a metal carbide.

The thermal conductivity of the composition can be improved by adding the inorganic filler. A kind of the inorganic filler is not limited particularly. The inorganic filler includes a carbon compound such as graphite, carbon nanotube, diamond; a metal oxide such as aluminium oxide, magnesium oxide, beryllium oxide, titanium oxide, zirconium oxide, and zinc oxide; a metal nitride such as boron nitride, aluminium nitride, and silicon nitride; a metal carbide such as boron carbide, aluminium carbide, and silicon carbide; buried product of organic polymer such as burned product of acrylonitrile polymer, burned product of furan resin, burned product of cresol resin, burned product of polyvinyl chloride, burned product of sucrose, and burned product of charcoal, composite ferrite with Zn ferrite, Fe—Al—Si tertiary alloy, metal powder such as aluminium powder, copper powder, silver powder, nickel powder, crystal silica and the like. The inorganic filler can be used individually or in the combination of two or more inorganic fillers. The shape of the inorganic filler is not limited particularly, and may be a spherical shape, a plate shape such as a scaly shape, a shatter shape and the like. The inorganic filler having the above shape can be used individually or in the combination of two or more inorganic fillers. It is preferable that at least one aluminium powder is contained in the composition in the viewpoint of the improvement of the thermal conductivity from increase of packed amount and easy availability. In addition, the inorganic filler may be modified on the surface thereof by the previous treatment of silane coupling agent, titanate coupling agent and the like in order to improve the dispersibility of the inorganic filler with the resin.

It is preferable that the inorganic filler (B) is at least one inorganic filler selected from the group consisting of aluminium having spherical shape, aluminium having a scaly shape, boron nitride, and silicon carbide having a shatter shape. The inorganic filler having the spherical shape can improve the thermal conductivity, printing property, appearance (flatness) in the balanced manner. On the other hand, the inorganic filler having a shape other than the spherical shape can improve further thermal conductivity.

An amount of the inorganic filler (B) is preferably 50 to 90% by weight, more preferably 65 to 90% by weight, even preferably 75 to 90% by weight, and even more preferably 80 to 90% by weight, per 100% by weight of the thermally conductive resin composition. In the case where the amount of the inorganic filler is less than 50% by weight, the thermal conductivity is decreased to 2 W/m·K or less, and the thermal management cannot be realized. On the other hand, in the case where the amount of the inorganic filler (B) is more than 90% by weight, it is difficult to uniformly knead each of components of the composition.

The spherical powder is contained in the inorganic filler (B), an amount of the spherical powder is preferably 50% by weight or more, more preferably 90% by weight or more, per 100% by weight of a total amount of the inorganic filler (B). When the amount of the spherical powder is less than 50% by weight, the flatness is deteriorated in some cases.

In addition, a powder having preferably an average particle diameter of 50 μm or less, and more preferably an average particle diameter of 20 μm or less is contained in the inorganic filler (B). In the case where the average particle diameter is more than 50 μm, the flatness is deteriorated in some cases. In the present invention, the average particle diameter of the inorganic filler is represented by a particle diameter corresponding to 50% in the weight-based cumulative particle size distribution, that is, D50 (median diameter).

Preferably, the powder having an average particle diameter of 1 to 3 μm is contained in the inorganic filler (B), and an amount of the powder is 40% by weight or more per 100% by weight of a total amount of the inorganic filler (B). More preferably, the powder having an average particle diameter of 1 to 3 μm is contained in inorganic filler (B), an amount of the powder is 40% by weight or more per 100% by weight of a total amount of the inorganic filler (B), the spherical powder is contained in the inorganic filler (B), and an amount of the spherical powder is 90% by weight or more per 100% by weight of a total amount of the inorganic filler (B). Even preferably, the powder having an average particle diameter of 1 to 3 μm is contained in the inorganic filler (B), an amount of the powder is 40% by weight or more per 100% by weight of a total amount of the inorganic filler (B), the powder having an average particle diameter of 20 μm or less is contained in the inorganic filler (B), and an amount of the powder is 90% by weight or more per 100% by weight of a total amount of the inorganic filler (B). Even preferably, the powder having an average particle diameter of 1 to 3 μm is contained in the inorganic filler (B), an amount of the powder is 40% by weight or more per 100% by weight of a total amount of the inorganic filler (B), the spherical powder is contained the inorganic filler (B), an amount of the spherical powder is 90% by weight or more per 100% by weight of a total amount of the inorganic filler (B), the powder having an average particle diameter of 20 μm or less is contained in the inorganic filler (B), an amount of the powder is 90% by weight or more per 100% by weight of a total amount of the inorganic filler (B). When the powder having an average particle diameter of 1 to 3 μm is contained in the inorganic filler (B) and an amount of the powder is less than 40% by weight, the appearance (flatness) on the pattern surface obtained by screen printing cannot be maintained in some cases.

In addition, it is preferable that the powder having an average particle diameter of 4 to 20 μm is contained in the inorganic filler (B), an amount of the powder is 40% by weight or more per 100% by weight of a total amount of the inorganic filler (B).

It is more preferable that the powder having an average particle diameter of 4 to 20 μm is contained in the inorganic filler (B), an amount of the powder is 40% by weight or more per 100% by weight of a total amount of the inorganic filler (B), the spherical powder is contained in the inorganic filler (B), and an amount of the spherical powder is 80% by weight or more per 100% by weight of a total amount of the inorganic filler (B). In the case where the amount of the powder is less than 40% by weight, the thermal conductivity is decreased to 4 W/m·K or less, and thermal management cannot be sufficiently realized in some cases. In the present invention, the powder having an average particle diameter of 3 to 4 μm in the inorganic filler may be contained in the powder having an average particle diameter of 1 to 3 μm in the inorganic filler.

The powder having an average particle diameter of more than 20 μm may be contained in the inorganic filler (B), an amount of the powder is 0 to 40% by weight per 100% by weight of a total amount of the inorganic filler (B). When the inorganic filler (B) contains powder having an average particle diameter of more than 20 μm, an amount of the powder is preferably 2 to 35% by weight, more preferably 5 to 30% by weight, even preferably 10 to 25% by weight, per 100% by weight of a total amount of the inorganic filler (B). When the inorganic filler satisfies the above numerical range, the thermal conductivity can be further improved.

Liquid Resin (Liquid Compound) (C) Having a Viscosity of 100 Pa·s or Less at 25° C.:

It is preferable that the thermally conductive resin composition further contains a liquid resin (C) having a viscosity of 100 Pa·s or less at 25° C., and the liquid resin (C) has a weight loss of less than 10% when stored at 150° C. for 100 hours under an atmosphere.

By selecting the liquid resin (C), the thermally conductive resin composition can contain the inorganic filler (B) in a large amount. The viscosity at 25° C. of the liquid resin (C) is not limited particularly, and is preferably 100 Pa·s or less, more preferably 95 Pa·s or less, even preferably 90 Pa·s or less, even more preferably 85 Pa·s or less, and particularly preferably 80 Pa·s or less. In the case where the viscosity is more than 100 Pa·s, it is difficult to unifoiitily knead each of components of the composition in some cases.

The viscosity can be measured by using a capillary viscometer such as ubbelohde viscometer.

A kind of the liquid resin (C) includes acrylate resin, polyisoprene, polybutadiene, fatty acid ester, polybasic acid ester, and the like.

The acrylate resin may be an acrylate resin having a reactive group at both terminal, and telechelic polyacrylate (manufactured by Kaneka Corporation, SA100S, SA110S, SA120S, SA310S), and the like may be used.

Another acrylate resin may be an acrylate resin having no functional group, and acrylate resins of ARUFON (registered trademark) series manufactured by TOAGOSEI CO., LTD such as UP-1000, UP-1010, UP-1020, UP-1021, UP-1061, UP-1080, UP-1110, UP-1170, UP-1172, UP-1190, UP-1500, and the like may be used.

Among those exemplified in the above resin (A), the fatty acid ester may be a compound in which one or both of the melting point and a weight loss are not satisfied.

The polybasic acid ester may be a compound in which one or more carboxyl groups are esterified. The polybasic acid ester includes glutaric acid ester which may be substituted, pyromellitic acid ester which may be substituted, adipic acid which may be substituted, and the like. The substituent includes a linear alkyl group having carbon atoms 1 to 20 such as methyl group, ethyl group, propyl group, butyl group, pentyl group, hexyl group, octyl group, nonyl group, decyl group, undecyl group, dodecyl group, tridecyl group, tetradecyl group; a branched alkyl group having carbon atoms 1 to 20 such as isopropyl group, isobutyl group, tert-butyl group, and the like. The commercially available polybasic acid ester may be pyromellitic acid ester substituted with octyl group (manufactured by DIC Corporation, W-7010 and the like).

The liquid resin (C) preferably contains at least one acrylate resin in the viewpoints of an appropriate viscosity when dissolved in an organic solvent, easy availability and printing property.

In addition, the liquid resin (C) has a weight loss of preferably less than 10%, more preferably 9.8% or less, even preferably 9.6% or less, even more preferably 9.4% or less, particularly preferably 9.2% or less, and most preferably 9.0% or less, when the liquid resin (C) is stored at 150° C. for 100 hours under an atmosphere. The lower limit of the weight loss is, for example, 0.1%, 0.2%, or 0.3%. The weight loss can be measured as set forth below. In the case when the weight loss is more than 10%, it is difficult to exhibit sufficient heat resistance of the composition in some cases.

The liquid resin (C) is contained in an amount of preferably 0 to 40% by weight, more preferably 1 to 38% by weight, even preferably 3 to 36% by weight, and even more preferably 5 to 34% by weight, per 100% by weight of the thermally conductive resin composition. It is preferable that the liquid resin (C) is added in the viewpoint of the improvement of the printing property. In the case where the liquid resin (C) is contained in an amount of more than 40% by weight, the improvement of the thermal conductivity is not expected in some cases.

The total amount of the resin (A) and the liquid resin (C) is, for example, 1 to 150 parts by weight, preferably 2 to 130 parts by weight, more preferably 3 to 100 parts by weight, even preferably 4 to 70 parts by weight, even more preferably 5 to 50 parts by weight, and particularly preferably 10 to 30 parts by weight, per 100 parts by weight of the inorganic filler (B). When the total amount of the resin (A) and the liquid resin (C) is small, it is difficult to uniformly knead each of components of the composition in some cases. On the other hand, when the total amount of the resin (A) and the liquid resin (C) is large, the thermal conductivity is decreased in some cases.

Other Components (D):

In addition to the resin (A), the inorganic filler (B), and the liquid resin (C), a resin except the resin (A) and the liquid resin (C), an antioxidant, a plasticizer, an extender, a thixotropic agent, a tackifier, a dehydrating agent, a coupling agent, a flame retardant, a filler, a solvent and the like can be added to the the oily conductive resin composition, if necessary.

A method for uniformly kneading each of components of the thermally conductive resin composition of the present invention is not limited particularly. The thermally conductive resin composition can be obtained by previously kneading components at a room temperature and agitating and kneading components at a room temperature, or melting and kneading components using heating roll, kneader, extruder, and the like. A temperature for kneading components is not limited particularly as long as the resin is not thermally decomposed, and the temperature for kneading components is preferably 100° C. or less.

The organic solvent used in screen printing of the thermally conductive resin composition of the present invention is not limited particularly as long as the organic solvent is evaporated during drying at 100° C. or less after screen printing. As the organic solvent, hydrocarbon solvent such as dodecane, tetradecane and the like can be used. An amount of the organic solvent is not limited particularly as long as bleeding is not generated between patterns in screen printing, and the amount of the organic solvent is preferably 10% by weight or less per 100% by weight of the thermally conductive resin composition.

The thermal conductivity at 25° C. of the thermally conductive resin composition of the present invention is, for example, 0.5 W/m·K or more, preferably 1.0 W/m·K or more, more preferably 1.5 W/m·K or more, even preferably 3.0 W/m·K or more, and even more preferably 4.0 W/m·K or more. The upper limit of the thermal conductivity is, for example, 30 W/m·K, and preferably 20 W/m·K. The thermal conductivity can be measured by using hot disc thermal constant analyzer (manufactured by KYOTO ELECTRONICS MANUFACTUREING CO., LTD, TPA-501).

The thermally conductive resin composition of the present invention is suitably used for thermal interface material (TIM), particularly TIM for a semiconductor module in the viewpoints of phase transition with heat, adhesion to the substrate due to softening, and small heat resistance, and sufficient heat dissipating property.

The present application claims the benefit of priority to Japanese Patent Application Number 2015-133943 filed on Jul. 2, 2015. The entire contents of the specification of Japanese Patent Application Number 2015-133943 filed on Jul. 2, 2015 are hereby incorporated by reference.

EXAMPLES

Next, the present invention will be described in detail with reference to Examples, but the present invention is not limited thereto.

<Measurement of Weight Loss>

A weight loss of resin used in each of Examples was measured according to the following condition. The weight loss was obtained by setting 2 g of a resin (A) or a liquid resin (C) on a petri dish having a diameter of 45 mm, and measuring a weight loss of the resin when stored at 150° C. for 100 hours under an atmosphere.

A weight loss of the following resins (A) was measured when stored at 150° C. for 100 hours under an atmosphere. Each of the resins (A) was fatty acid ester (manufactured by NOF CORPORATION, UNISTER (registered trademark) H-476D), fatty acid ester (manufactured by NOF CORPORATION, UNISTER (registered trademark) H-476), fatty acid amide (manufactured by Nippon Kasei Chemical Co., Ltd, DIAMID O-200), chain saturated hydrocarbon (hexacosane, dotriacontane). Results are shown in Table 1.

TABLE 1

|  | Fatty acid ester (H-476D) | Fatty acid ester (H-476) | Fatty acid amide (O-200) | Chain saturated hydrocarbon (hexacone) | Chain saturated hydrocarbon (dotriacontane) |
|---|---|---|---|---|---|
| Melting point (° C.) | 53 | 62 | 75 | 56 | 69 |
| Weight loss (%) | 9.4 | 8.8 | 8.1 | 51.4 | 34.3 |

Chain saturated hydrocarbons (hexacosane, dotriacontane) had a melting point of 40 to 100° C., and had a weight loss of more than 10% when stored at 150° C. for 100 hours under an atmosphere.

Therefore, these chain saturated hydrocarbons were not suitable for a component of the thermally conductive resin composition of the present invention.

A weight loss of the following liquid resins (C) was measured when stored at 150° C. for 100 hours under an atmosphere. Each of the liquid resins (C) was acrylate resin (manufactured by Kaneka Corporation, XMAP SA120S), acrylate resin (manufactured by Toagosei Co., Ltd, ARUFON UP-1080), acrylate resin (manufactured by Toagosei Co., Ltd, ARUFON UP-1172), polybasic acid ester (manufactured by DIC Corporation, Monocizer W-7010), chain saturated hydrocarbon (hexadecane). Results are shown in Table 2.

TABLE 2

|  | Acrylate resin (SA120S) | Acrylate resin (UP-1080) | Acrylate resin (UP-1172) | Polybasic acid ester (W-7010) | Chain saturated hydrocarbon (hexadecane) |
|---|---|---|---|---|---|
| Viscosity (Pa·s) | 70 | 5 | 22 | 0.45 | 0.003 |
| Weight loss (%) | 0.7 | 7.8 | 7.9 | 0.5 | 100 |

Chain saturated hydrocarbon (hexadecane) had a viscosity of 100 Pa·s or less at 25° C., and a weight loss of more than 10% when stored at 150° C. for 100 hours under an atmosphere. Therefore, the chain saturated hydrocarbon was not suitable for a component of the thermally conductive resin composition of the present invention.

<Measurement of Thermal Conductivity>

The thermal conductivities of Examples were measured according to the following analytical devices and conditions.

The thermal conductivities of the obtained compositions (size of test piece of 10×10×3 mm) were measured using hot disc theLmal constant analyzer (manufactured by KYOTO ETECTRONICS MANUFACTUREING CO., LTD, TPA-501).

<Test of Printing Property, Appearance (Flatness)>

Each of obtained compositions was dissolved in dodecane (4% by weight of 100% by weight of composition), a mixture was printed on a plate (material: SUS, thickness of 0.2 mm) using screen printing machine (manufactured by NEWLONG SEIMITSU KOGYO CO., LTD, HP-320), and printed plate was dried at 100° C. for 5 minutes to evaluate printing property, appearance (flatness).

Criteria for Evaluating Printing Property:
Very easy supply of composition on printing side: ○
Easy supply of composition on printing side: Δ
Hard supply of composition on printing side: ×

Criteria for evaluating appearance (flatness):
Very small undulation on pattern surface: ○
Small undulation on patteri surface: Δ
Large undulation on pattetii surface: ×

Example 1

Resin (A) having a melting point of 40 to 100° C.:
Fatty acid ester (manufactured by NOF CORPORATION, UNISTER (registered trademark) H-476D) 50.0 parts by weight
Inorganic filler (B):
Aluminium (manufactured by Toyo Aluminium K.K, TFH-A02P, spherical shape, average particle diameter (D50) of 2 μm) 50.0 parts by weight These components were heated and melted at 100° C., and kneaded to prepare a uniform composition.

Example 2

Resin (A) having a melting point of 40 to 100° C.:
Fatty acid ester (manufactured by NOF CORPORATION, UNISTER (registered trademark) H-476D) 2.3 parts by weight
Inorganic filler (B):
Aluminium (manufactured by Toyo Aluminium K.K, TFH-A02P, spherical shape, average particle diameter (D50) of 2 μm) 84.7 parts by weight
Liquid resin (C) having a viscosity of 100 Pa·s or less at 25° C.:
Polybasic acid ester (manufactured by DIC Corporation, Monocizer W-7010) 13.0 parts by weight These components were mixed to prepare a composition in the same manner as in Example 1.

Example 3

Resin (A) having a melting point of 40 to 100° C.:
Fatty acid ester (manufactured by NOF CORPORATION, UNISTER (registered trademark) H-476D) 5.6 parts by weight
Inorganic filler (B):
Aluminium (manufactured by Toyo Aluminium K.K, TFH-A02P, spherical shape, average particle diameter (D50) of 2 μm) 16.7 parts by weight
Aluminium (manufactured by Toyo Aluminium K.K, 13-0087, spherical shape, average particle diameter (D50) of 9 μm) 16.7 parts by weight
Aluminium (manufactured by Toyo Aluminium K.K, 13-0090, spherical shape, average particle diameter (D50) of 14 μm) 16.7 parts by weight
Boron nitride (manufactured by Momentive Performance Materials Inc., PT-110, scaly shape, average particle diameter (D50) of 45 μm) 12.5 parts by weight
Liquid resin (C) having a viscosity of 100 Pa·s or less at 25° C.:
Acrylate resin (manufactured by Kaneka Corporation, XMAP SA120S) 22.2 parts by weight
Acrylate resin (manufactured by Toagosei Co., Ltd, ARUFON UP-1080) 9.7 parts by weight These components were mixed to prepare a composition in the same manner as in Example 1.

Example 4

Resin (A) having a melting point of 40 to 100° C.:
Fatty acid ester (manufactured by NOF CORPORATION, UNISTER (registered trademark) H-476D) 2.3 parts by weight
Inorganic filler (B):
Aluminium (manufactured by Toyo Aluminium K.K, TFH-A02P, spherical shape, average particle diameter (D50) of 2 μm) 72.7 parts by weight
Boron nitride (manufactured by Momentive Performance Materials Inc., PT-110, scaly shape, average particle diameter (D50) of 45 μm) 11.6 parts by weight
Liquid resin (C) having a viscosity of 100 Pa·s or less at 25° C.:
Acrylate resin (manufactured by Kaneka Corporation, XMAP SA120S) 9.3 parts by weight
Acrylate resin (manufactured by Toagosei Co., Ltd, ARUFON UP-1080) 4.1 parts by weight
These components were mixed to prepare a composition in the same manner as in Example 1.

Example 5

Resin (A) having a melting point of 40 to 100° C.:
Fatty acid ester (manufactured by NOF CORPORATION, UNISTER (registered trademark) H-476D) 1.7 parts by weight
Inorganic filler (B):
Aluminium (manufactured by Toyo Aluminium K.K, TFH-A02P, spherical shape, average particle diameter (D50) of 2 μm) 29.5 parts by weight
Aluminium (manufactured by Toyo Aluminium K.K, 13-0087, spherical shape, average particle diameter (D50) of 9 μm) 29.5 parts by weight
Aluminium (manufactured by Toyo Aluminium K.K, 13-0090, spherical shape, average particle diameter (D50) of 14 μm) 29.5 parts by weight
Liquid resin (C) having a viscosity of 100 Pa·s or less at 25° C.:
Acrylate resin (manufactured by Kaneka Corporation, XMAP SA120S) 6.8 parts by weight
Acrylate resin (manufactured by Toagosei Co., Ltd, ARUFON UP-1080) 3.0 parts by weight
These components were mixed to prepare a composition in the same manner as in Example 1.

Example 6

Resin (A) having a melting point of 40 to 100° C.:
Fatty acid ester (manufactured by NOF CORPORATION, UNISTER (registered trademark) H-476D) 2.3 parts by weight
Inorganic filler (B):
Aluminium (manufactured by Toyo Aluminium K.K, TFH-A02P, spherical shape, average particle diameter (D50) of 2 μm) 84.7 parts by weight
Liquid resin (C) having a viscosity of 100 Pa·s or less at 25° C.:
Acrylate resin (manufactured by Kaneka Corporation, XMAP SA120S) 9.0 parts by weight
Acrylate resin (manufactured by Toagosei Co., Ltd, ARUFON UP-1080) 4.0 parts by weight
These components were mixed to prepare a composition in the same manner as in Example 1.

Example 7

Resin (A) having a melting point of 40 to 100° C.:
Fatty acid ester (manufactured by NOF CORPORATION, UNISTER (registered trademark) H-476D) 1.7 parts by weight
Inorganic filler (B):
Aluminium (manufactured by Toyo Aluminium K.K, TFH-A02P, spherical shape, average particle diameter (D50) of 2 μm) 44.3 parts by weight
Aluminium (manufactured by Toyo Aluminium K.K, 13-0087, spherical shape, average particle diameter (D50) of 9 μm) 22.2 parts by weight
Aluminium (manufactured by Toyo Aluminium K.K, 13-0090, spherical shape, average particle diameter (D50) of 14 μm) 22.2 parts by weight
Liquid resin (C) having a viscosity of 100 Pa·s or less at 25° C.:
Acrylate resin (manufactured by Kaneka Corporation, XMAP SA120S) 6.8 parts by weight
Acrylate resin (manufactured by Toagosei Co., Ltd, ARUFON UP-1080) 3.0 parts by weight
These components were mixed to prepare a composition in the same manner as in Example 1.

Example 8

Resin (A) having a melting point of 40 to 100° C.:
Fatty acid ester (manufactured by NOF CORPORATION, UNISTER (registered trademark) H-476D) 1.2 parts by weight
Inorganic filler (B):
Aluminium (manufactured by Toyo Aluminium K.K, TFH-A02P, spherical shape, average particle diameter (D50) of 2 μm) 33.6 parts by weight
Aluminium (manufactured by Toyo Aluminium K.K, TFH-A10P, spherical shape, average particle diameter (D50) of 10 μm) 16.8 parts by weight
Aluminium (manufactured by Toyo Aluminium K.K, 13-0090, spherical shape, average particle diameter (D50) of 14 μm) 16.8 parts by weight
Silicon carbide (manufactured by Shinano Electric Refining Co., Ltd, GP #320, shatter shape, average particle diameter (D50) of 40 μm) 21.6 parts by weight
Liquid resin (C) having a viscosity of 100 Pa·s or less at 25° C.:
Acrylate resin (manufactured by Toagosei Co., Ltd, ARUFON UP-1172) 10.1 parts by weight
These components were mixed to prepare a composition in the same manner as in Example 1.

Example 9

Resin (A) having a melting point of 40 to 100° C.:
Fatty acid ester (manufactured by NOF CORPORATION, UNISTER (registered trademark) H-476D) 1.2 parts by weight
Inorganic filler (B):
Aluminium (manufactured by Toyo Aluminium K.K, TFH-A02P, spherical shape, average particle diameter (D50) of 2 μm) 37.6 parts by weight
Aluminium (manufactured by Toyo Aluminium K.K, TFH-A10P, spherical shape, average particle diameter (D50) of 10 μm) 11.3 parts by weight
Aluminium (manufactured by Toyo Aluminium K.K, TFH-A20P, spherical shape, average particle diameter (D50) of 20 μm) 26.3 parts by weight Aluminium (manufactured by Toyo Aluminium K.K, P0100, scaly shape, average particle diameter (D50) of 15 μm) 1.9 parts by weight
Silicon carbide (manufactured by Shinano Electric Refining Co., Ltd, GP #320, shatter shape, average particle diameter (D50) of 40 μm) 12.1 parts by weight
Liquid resin (C) having a viscosity of 100 Pa·s or less at 25° C.:
Acrylate resin (manufactured by Toagosei Co., Ltd, ARUFON UP-1172) 7.4 parts by weight
Polybasic acid ester (manufactured by DIC Corporation, Monocizer W-7010) 2.3 parts by weight These components were mixed to prepare a composition in the same manner as in Example 1.

Example 10

Resin (A) having a melting point of 40 to 100° C.:
Fatty acid ester (manufactured by NOF CORPORATION, UNISTER (registered trademark) H-476D) 1.3 parts by weight
Inorganic filler (B):
Aluminium (manufactured by Toyo Aluminium K.K, TFH-A02P, spherical shape, average particle diameter (D50) of 2 μm) 28.7 parts by weight
Aluminium (manufactured by Toyo Aluminium K.K, TFH-A10P, spherical shape, average particle diameter (D50) of 10 μm) 21.5 parts by weight
Aluminium (manufactured by Toyo Aluminium K.K, TFH-A20P, spherical shape, average particle diameter (D50) of 20 μm) 21.5 parts by weight
Boron nitride (manufactured by Denka Company Limited, scaly shape, average particle diameter (D50) of 18 μm) 16.2 parts by weight
Liquid resin (C) having a viscosity of 100 Pa·s or less at 25° C.:
Acrylate resin (manufactured by Toagosei Co., Ltd, ARUFON UP-1172) 10.8 parts by weight These components were mixed to prepare a composition in the same manner as in Example 1.

Example 11

Resin (A) having a melting point of 40 to 100° C.:
Fatty acid ester (manufactured by NOF CORPORATION, UNISTER (registered trademark) H-476) 1.6 parts by weight
Inorganic filler (B):
Aluminium (manufactured by Toyo Aluminium K.K, TFH-A02P, spherical shape, average particle diameter (D50) of 2 μm) 44.4 parts by weight
Aluminium (manufactured by Toyo Aluminium K.K, 13-0087, spherical shape, average particle diameter (D50) of 9 μm) 22.2 parts by weight
Aluminium (manufactured by Toyo Aluminium K.K, 13-0090, spherical shape, average particle diameter (D50) of 14 μm) 22.2 parts by weight
Liquid resin (C) having a viscosity of 100 Pa·s or less at 25° C.:
Acrylate resin (manufactured by Kaneka Corporation, XMAP SA120S) 6.7 parts by weight
Acrylate resin (manufactured by Toagosei Co., Ltd, ARUFON UP-1080) 2.9 parts by weight These components were mixed to prepare a composition in the same manner as in Example 1.

Example 12

Resin (A) having a melting point of 40 to 100° C.:
Fatty acid amide (manufactured by Nippon Kasei Chemical Co., Ltd, DIAMID O-200) 2.6 parts by weight
Inorganic filler (B):
Aluminium (manufactured by Toyo Aluminium K.K, TFH-A02P, spherical shape, average particle diameter (D50) of 2 μm) 16.9 parts by weight
Aluminium (manufactured by Toyo Aluminium K.K, 13-0087, spherical shape, average particle diameter (D50) of 9 μm) 25.3 parts by weight
Aluminium (manufactured by Toyo Aluminium K.K, 13-0090, spherical shape, average particle diameter (D50) of 14 μm) 42.2 parts by weight
Liquid resin (C) having a viscosity of 100 Pa·s or less at 25° C.:
Acrylate resin (manufactured by Kaneka Corporation, XMAP SA120S) 7.8 parts by weight
Acrylate resin (manufactured by Toagosei Co., Ltd, ARUFON UP-1080) 5.2 parts by weight These components were mixed to prepare a composition in the same manner as in Example 1.

Each of physical properties of the thermally conductive resin compositions prepared in Examples 1 to 12 was measured. Results are shown in Table 3.

TABLE 3

| | | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Resin (A) | Fatty acid ester (H-476D) Melting point 53° C., Weight loss 9.4% | 50.0 | 2.3 | 5.6 | 2.3 | 1.7 | 2.3 | 1.7 | 1.2 | 1.2 | 1.3 | | |
| | Fatty acid ester (H-476) Melting point 62° C., Weight loss 8.8% | | | | | | | | | | | 1.6 | |
| | Fatty acid amide (O-200) Melting point 75° C., Weight loss 8.1% | | | | | | | | | | | | 2.6 |
| Liquid resin (C) | Acrylate resin (SA1205) Visscosity 70 Pa · s, Weight loss 0.7% | | 22.2 | 9.3 | 6.8 | 9.0 | 6.8 | | | | 6.7 | 7.8 |
| | Acrylate resin (UP-1080) Viscosity 5 Pa · s, Weight loss 7.8% | | 9.7 | 4.1 | 3.0 | 4.0 | 3.0 | | | | 2.9 | 5.2 |
| | Acrylate resin (UP-1172) Viscosity 22 Pa · s, Weight loss 7.9% | | | | | | | 10.1 | 7.4 | 10.8 | | |
| | Polybasic acid ester (W-7010) Viscosity 0.45 Pa · s, Weight loss 0.5% | | 13.0 | | | | | | 2.3 | | | |
| Inorganic filler (B) | Aluminium (TFH-A02P, spherical shape, D50 2 μm) | 50.0 | 84.7 | 16.7 | 72.7 | 29.5 | 84.7 | 44.3 | 33.6 | 37.6 | 28.7 | 44.4 | 16.9 |
| | Aluminium (13-0087, spherical shape, D50 9 μm) | | | 16.7 | | 29.5 | | 22.2 | | | | 22.2 | 25.3 |
| | Aluminium (TFH-A10P, spherical shape, D50 10 μm) | | | | | | | | 16.8 | 11.3 | 21.5 | | |
| | Aluminium (13-0090, spherical shape, D50 14 μm) | | | 16.7 | | 29.5 | | 22.2 | 16.8 | 26.3 | | 22.2 | 42.2 |
| | Aluminium (TFH-A20P, spherical shape, D50 20 μm) | | | | | | | | | | 21.5 | | |
| | Aluminium (P0100, scaly shape, D50 15 μm) | | | | | | | | | 1.9 | | | |
| | Boron nitride (SGP, scaly shape, D50 18 μm) | | | | | | | | | | 16.2 | | |
| | Boron nitride (PT-110, scaly shape, D50 45 μm) | | | 12.5 | 11.6 | | | | | | | | |
| | Silicon carbide (GP#320, shatter shape, D50 40 μm) | | | | | | | | 21.6 | 12.1 | | | |

TABLE 3-continued

| | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|
| Amount of inorganic filler (B) per 100% by weight of composition (% by weight) | 50.0 | 84.7 | 62.5 | 84.3 | 88.5 | 84.7 | 88.7 | 88.8 | 89.2 | 87.9 | 88.8 | 84.4 |
| Amount of spherical powder per 100% by weight of inorganic filler (B) (% by weight) | 100.0 | 100.0 | 80.0 | 86.2 | 100.0 | 100.0 | 100.0 | 75.7 | 84.3 | 81.6 | 100 | 100 |
| Amount of scaly powder per 100% by weight of inorganic filler (B) (% by weight) | 0.0 | 0.0 | 20.0 | 13.8 | 0.0 | 0.0 | 0.0 | 0.0 | 2.1 | 18.4 | 0.0 | 0.0 |
| Amount of shatter powder per 100% by weight of inorganic filler (B) (% by weight) | 0.0 | 0.0 | 0.0 | 0.0 | 0.0 | 0.0 | 0.0 | 24.3 | 13.6 | 0.0 | 0.0 | 0.0 |
| Amount of powder having average particle diameter of 1 to 3 μm per 100% by weight of inorganic filler (B) (% by weight) | 100.0 | 100.0 | 26.7 | 86.2 | 33.3 | 100.0 | 49.9 | 37.8 | 42.2 | 32.7 | 50.0 | 20.0 |
| Amount of powder having average particle diameter of 4 to 20 μm per 100% by weight of inorganic filler (B) (% by weight) | 0.0 | 0.0 | 53.4 | 0.0 | 66.7 | 0.0 | 50.1 | 37.8 | 44.3 | 67.3 | 50.0 | 80.0 |
| Amount of powder having average particle diameter of more than 20 μm per 100% by weight of inorganic filler (B) (% by weight) | 0.0 | 0.0 | 20.0 | 13.8 | 0.0 | 0.0 | 0.0 | 24.3 | 13.6 | 0.0 | 0.0 | 0.0 |
| Amount of resin (A) and liquid resin (C) per 100 parts by weight of inorganic filler (B) (parts by weight) | 100 | 18.0 | 60.0 | 18.6 | 13.0 | 18.0 | 12.9 | 12.8 | 12.3 | 13.8 | 12.6 | 18.5 |
| Thermal conductivity (W/m · K) | 0.8 | 2.6 | 1.2 | 3.5 | 4.3 | 2.5 | 4.2 | 4.0 | 5.4 | 4.8 | 4.1 | 3.1 |
| Printing property | △ | △ | ○ | ○ | ○ | ○ | ○ | ○ | ○ | ○ | ○ | ○ |
| Appearance (flatness) | ○ | ○ | △ | △ | △ | ○ | ○ | △ | △ | △ | ○ | △ |

The invention claimed is:
1. A thermally conductive resin composition comprising:
a resin (A) having a melting point of from 40 to 100° C. and
an inorganic filler (B), and
a liquid resin (C)
wherein
the resin (A) has a weight loss of less than 10% when the resin (A) is stored at 150° C. for 100 hours under an atmosphere,
the resin (A) comprises a fatty acid ester or a fatty acid amide having from 1 to 100 carbon atoms,
the inorganic filler (B) comprises 90% by weight or more of a spherical powder per 100% by weight of a total amount of the inorganic filler (B),
the inorganic filler (B) comprises 40% by weight or more of a powder having an average particle diameter of from 1 to 3 μm per 100% by weight of a total amount of the inorganic filler (B), and
the liquid resin (C) comprises an acrylate resin.

2. The thermally conductive resin composition according to claim 1, wherein the inorganic filler (B) is at least one inorganic filler selected from the group consisting of a metal, a metal oxide, a metal nitride, and a metal carbide.

3. The thermally conductive resin composition according to claim 1, wherein the liquid resin (C) has a weight loss of less than 10% when the liquid resin (C) is stored at 150° C. for 100 hours under an atmosphere.

4. The thermally conductive resin composition according to claim 1, wherein an amount of the inorganic filler (B) is from 50 to 90% by weight per 100% by weight of the thermally conductive resin composition.

5. The thermally conductive resin composition according to claim 1, wherein the inorganic filler (B) comprise 40% by weight or more of a powder having an average particle diameter of 4 to 20 μm per 100% by weight of a total amount of the inorganic filler (B).

6. The thermally conductive resin composition according to claim 1, wherein the thermal conductivity at 25° C. of the thermally conductive resin composition is 0.5 W/m·K or more.

7. The thermally conductive resin composition according to claim 1, wherein the melting point of the resin (A) is 40 to 65° C.

8. The thermally conductive resin composition according to claim 1, wherein the resin (A) is the fatty acid ester having from 1 to 100 carbon atoms.

9. A thermal interface material comprising the thermally conductive resin composition of claim 1.

* * * * *